(12) United States Patent
Park et al.

(10) Patent No.: US 8,309,416 B2
(45) Date of Patent: Nov. 13, 2012

(54) SEMICONDUCTOR DEVICE WITH BURIED BIT LINES INTERCONNECTED TO ONE-SIDE-CONTACT AND FABRICATION METHOD THEREOF

(75) Inventors: Eun-Shil Park, Gyeonggi-do (KR);
Yong-Seok Eun, Gyeonggi-do (KR);
Kee-Jeung Lee, Gyeonggi-do (KR);
Min-Soo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 322 days.

(21) Appl. No.: 12/649,684

(22) Filed: Dec. 30, 2009

(65) Prior Publication Data
US 2011/0073925 A1    Mar. 31, 2011

(30) Foreign Application Priority Data

Sep. 30, 2009   (KR) .................. 10-2009-0093499

(51) Int. Cl.
*H01L 21/8242* (2006.01)
(52) U.S. Cl. ........ 438/253; 438/128; 438/256; 438/348; 257/E27.086; 257/E21.575
(58) Field of Classification Search .................. 438/128, 438/243, 253, 256, 270, 348, 424; 257/306, 257/773, E27.086, E21.24, E21.575, E21.646
See application file for complete search history.

(56) References Cited

U.S. PATENT DOCUMENTS

| | | | |
|---|---|---|---|
| 5,714,779 A * | 2/1998 | Auer et al. .................... | 257/306 |
| 6,808,979 B1 | 10/2004 | Lin et al. | |
| 6,936,512 B2 | 8/2005 | Chudzik et al. | |
| 7,078,307 B2 * | 7/2006 | Lin et al. ........................ | 438/386 |
| 7,838,925 B2 * | 11/2010 | Roesner et al. ............... | 257/328 |
| 2002/0066925 A1 | 6/2002 | Gruening et al. | |
| 2004/0029346 A1 | 2/2004 | Jaiprakash et al. | |
| 2004/0063277 A1 * | 4/2004 | Chudzik et al. ............... | 438/243 |
| 2010/0090348 A1 * | 4/2010 | Park et al. ..................... | 257/773 |

OTHER PUBLICATIONS

Notice of Allowance issued by the Korean Intellectual Property Office on Dec. 28, 2011.

* cited by examiner

*Primary Examiner* — Matthew Landau
*Assistant Examiner* — Colleen E Snow
(74) *Attorney, Agent, or Firm* — IP & T Group LLP

(57) ABSTRACT

A semiconductor device with reduced resistance of a buried bit line, and a method for fabricating the same. The method for fabricating a semiconductor device includes etching a semiconductor substrate to form a plurality of active regions which are separated from one another by trenches formed in between, forming a side contact on a sidewall of each active region, and forming metal bit lines, each filling a portion of a respective trench and connected to the side contact.

19 Claims, 16 Drawing Sheets

SEMICONDUCTOR DEVICE WITH BURIED BIT LINES INTERCONNECTED TO ONE-SIDE-CONTACT AND FABRICATION METHOD THEREOF

CROSS-REFERENCE TO RELATED APPLICATIONS

The present application claims priority of Korean Patent Application No. 10-2009-0093499, filed on Sep. 30, 2009, which is incorporated herein by reference in its entirety.

BACKGROUND OF THE INVENTION

Exemplary embodiments of the present invention relate to a method for fabricating a semiconductor device, and more particularly, to a semiconductor device having buried bit lines each connected to a one-side-contact, and a method for fabricating the same.

Conventional planar metal oxide semiconductor field effect transistors (MOSFET) are reaching their physical limitations with respect to leakage current, on-current, short channel effect, and further miniaturization of conventional MOSFETs is becoming more difficult. To overcome such limitations, semiconductor devices with vertical channels instead of typical planar channels are being developed.

A semiconductor device with vertical channels is fabricated by forming an annular gate electrode (hereafter referred to as "a vertical gate") surrounding an active pillar which is vertically extended over a semiconductor substrate and forming a source region and a drain region in the upper and lower portions of the active pillar with the gate electrode at the center.

FIG. 1 is a cross-sectional view of a conventional semiconductor device having vertical channels. Referring to FIG. 1, a plurality of pillar structures, each including an active pillar 12 which is extended perpendicularly to a substrate 11 and a hard mask layer 13. The external wall of the active pillar 12 is surrounded by a gate insulation layer 14 and a vertical gate 15, and buried bit lines 16 are formed inside the substrate 11 through an ion implantation of impurities. A trench 17 separating adjacent buried bit lines 16 from one another is filled with an interlayer dielectric layer 18. Word lines 19 are formed in a direction crossing the buried bit lines 16 while connecting adjacent vertical gates 15 to each other.

In the conventional semiconductor device, the buried bit lines 16 at the lower portion of the vertical gate 15 are formed by implanting a dopant through an ion implantation process. However, in miniaturizing semiconductor devices, reducing the resistance of a buried bit line 16 only with the dopant implantation becomes difficult and thus desired characteristics of the semiconductor devices are not obtained.

SUMMARY OF THE INVENTION

An embodiment of the present invention is directed to a semiconductor device with reduced resistance of a buried bit line, and a method for fabricating the same.

In accordance with an embodiment of the present invention, a method for fabricating a semiconductor device includes: etching a substrate to form a plurality of active regions which are separated from one another by trenches formed in between; forming a side contact on a sidewall of each active region; and forming metal bit lines each filling a portion of each trench and connected to the side contact.

In accordance with another embodiment of the present invention, a method for fabricating a semiconductor device includes: etching a semiconductor substrate to form a plurality of active regions separated from one another by trenches formed in between; forming a sacrificial layer gap-filling the trenches, wherein a protrusion is formed over each active region from the formation of the sacrificial layer; forming an insulation layer pattern contacting a sidewall of the protrusion; etching the sacrificial layer by using the insulation layer pattern as an etch barrier; forming contact regions each opening a sidewall of the active regions; forming side contacts each filling the contact regions; and forming metal bit lines each being connected to each side contact and filling a portion of each trench.

In accordance with yet another embodiment of the present invention, a method for fabricating a semiconductor device includes: etching a semiconductor substrate to form a plurality of active regions separated one from another by trenches formed in between; forming a sacrificial layer gap-filling the trenches, wherein a protrusion is formed over an upper portion of each active region from the formation of the sacrificial layer; forming an insulation layer over the substrate including the protrusion; implanting a dopant into the insulation layer through a tilt ion implantation process; forming an insulation layer pattern by selectively removing a portion of the insulation layer where the dopant is implanted; etching the sacrificial layer by using the insulation layer pattern as an etch barrier; forming contact regions each opening a sidewall of the active regions; forming side contacts each filling the contact regions; and forming metal bit lines, each being connected to each side contact and filling a portion of each trench.

In accordance with still another embodiment of the present invention, a semiconductor device includes: a semiconductor substrate; a plurality of active regions extending from a surface of the semiconductor substrate and separated from one another; a plurality of active pillars extending from a surface of each active region and separated from one another; a side contact configured to contact a sidewall of the active region; metal bit lines, each filling a portion of space between the active regions and connected to each side contact; and word lines formed on both sidewalls of the active pillars.

DESCRIPTION OF SPECIFIC EMBODIMENTS

Figure 1:
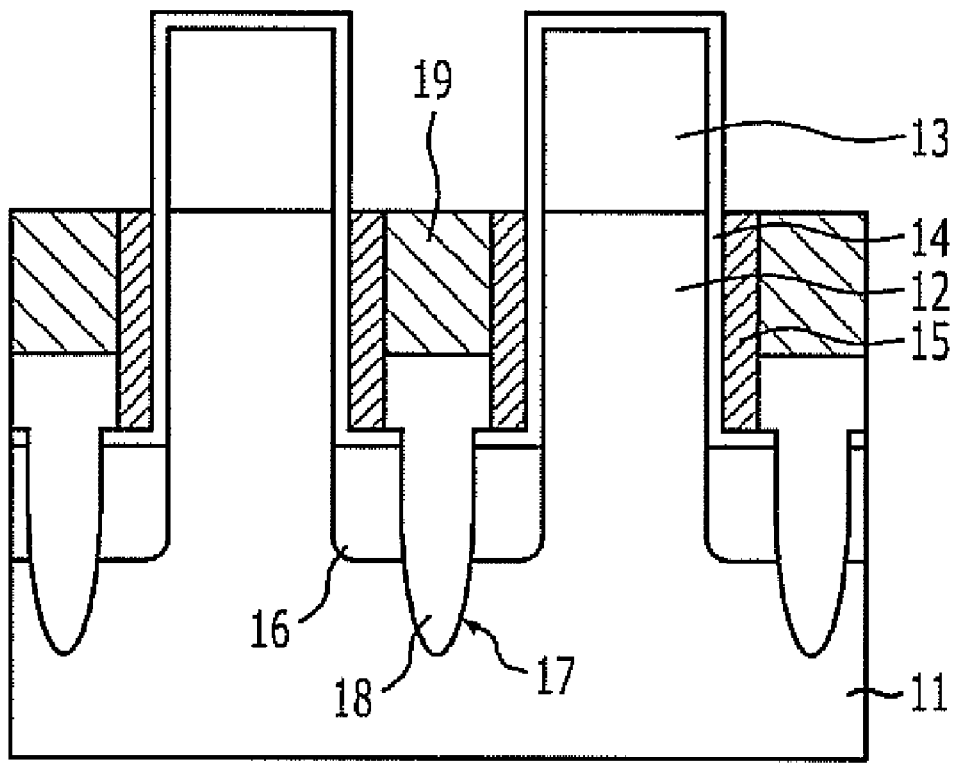
FIG. 1 is a cross-sectional view showing a conventional semiconductor device having vertical channels.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to an exemplary embodiment of the present invention, buried bit lines at the lower portion of an active pillar are formed of a metal layer over a semiconductor substrate. Also, a one-side-contact for a buried bit line is formed of a metal silicide for an ohmic contact between the buried bit line and an active region.

Since the buried bit line is contacted with the one-side-contact, a one-cell-one-bit line structure may be realized, which is advantageous for high integration.

Figure 2:
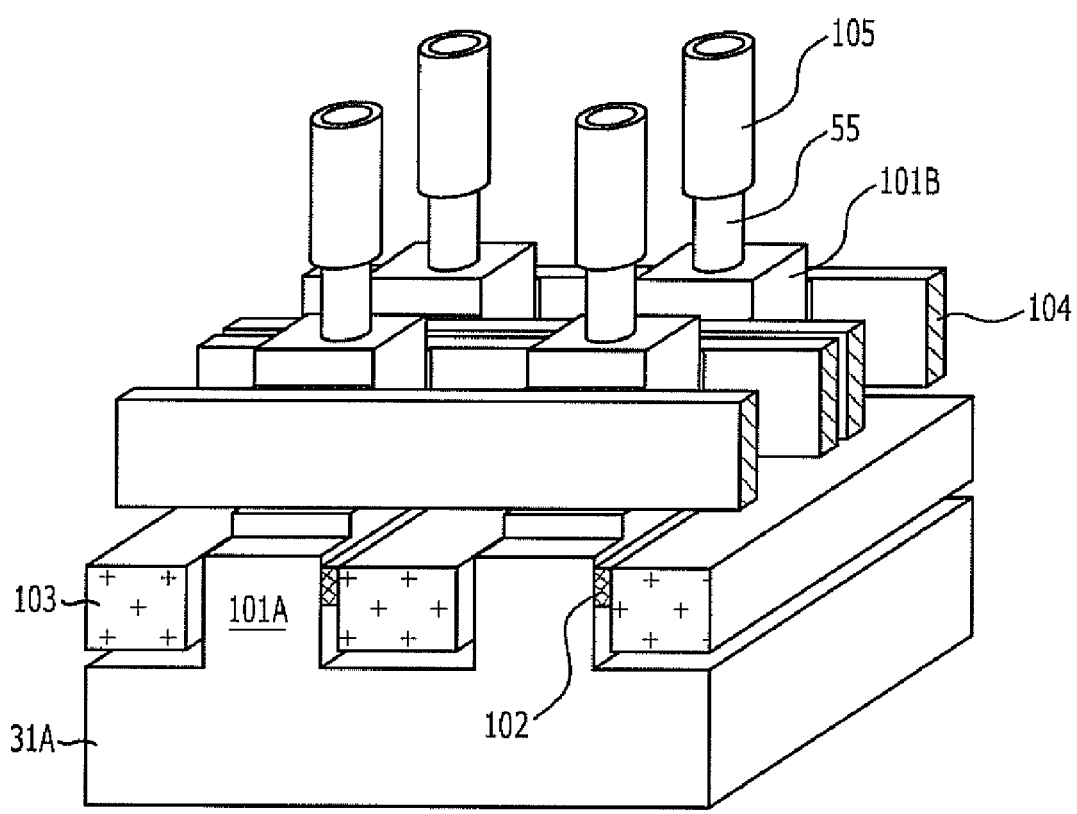
FIG. 2 is a perspective view of a semiconductor device in accordance with an embodiment of the present invention.

FIG. 2 is a perspective view illustrating a semiconductor device in accordance with an embodiment of the present invention. Referring to FIG. 2, the semiconductor device includes a plurality active regions 101A extended from the surface of a semiconductor substrate 31A and separated from each other, a plurality of active pillars 101B extended from the surface of the active regions 101A and separated from each other, side contacts 102 each configured to contact one sidewall of an active region 101A, metal bit lines 103 each connected to a side contact 102 and filling a portion of the space between the active regions 101A, and word lines 104 formed on both sidewalls of each active pillars 101B. The semiconductor device further includes storage node contact plugs 55 each connected to the upper portion of an active pillar 101B and storage nodes 105 formed over the storage node contact plugs 55.

The active regions 101A are formed in the shape of lines, and the active pillars 101B are formed to vertically extend from the surface of the active regions 101A. The side contacts 102 and the metal bit lines 103 form line arranged in parallel to the active regions 101A. The side contacts 102 include a metal silicide. The word lines 104 form lines crossing the metal bit lines 103.

The active regions 101A and the active pillars 101B include silicon, where the active pillars 101B may form square-shaped pillars.

The metal bit lines 103 include bit lines of a memory cell, and the word lines 104 include word lines of a memory cell. The storage nodes 105 become storage nodes of a capacitor of a memory cell. The active pillars 101B include channel regions of a memory cell transistor. Since the word lines 104 have a vertical structure, the channels in the active pillars 101B are formed in the vertical direction accordingly. Further, the word lines 104 may function as gate electrodes. Thus, one metal bit line 103, one active pillar 101B, and one word line 104 form a unit vertical cell.

Referring to FIG. 2, since the metal bit lines 103 are formed of a metal layer, they have relatively low resistance. Also, the metal bit lines 103 form buried bit lines in that they fill (at least partially) space between the active regions 101A. The active region 101A and the metal bit line 103 are electrically connected through the side contact 102. Since the side contact 102 includes a metal silicide, an ohmic contact is formed between the metal bit line 103 and the active region 101A. Since the word lines 104 have a vertical structure, the channels formed in the active pillars 101B are also formed in the vertical direction accordingly.

Figure 3A:
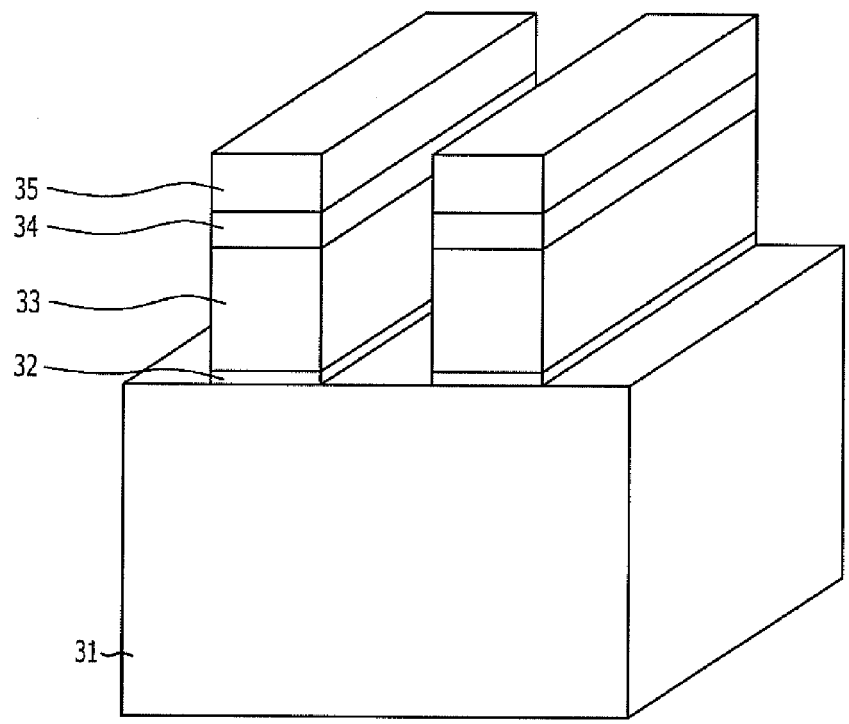
FIGS. 3A to 3P are cross-sectional views illustrating a method for fabricating a semiconductor device in accordance with an embodiment of the present invention.
Figure 3B:
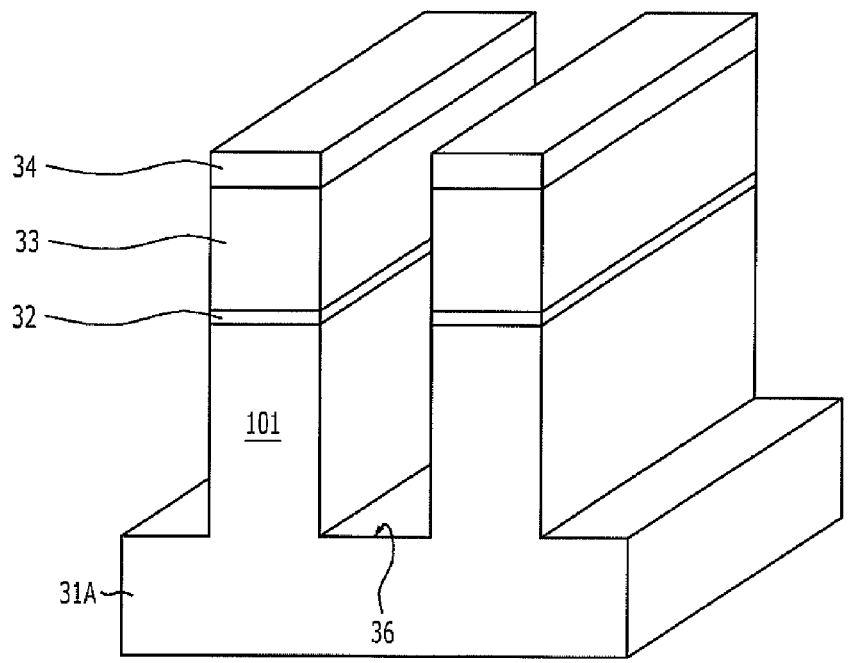
Figure 3C:
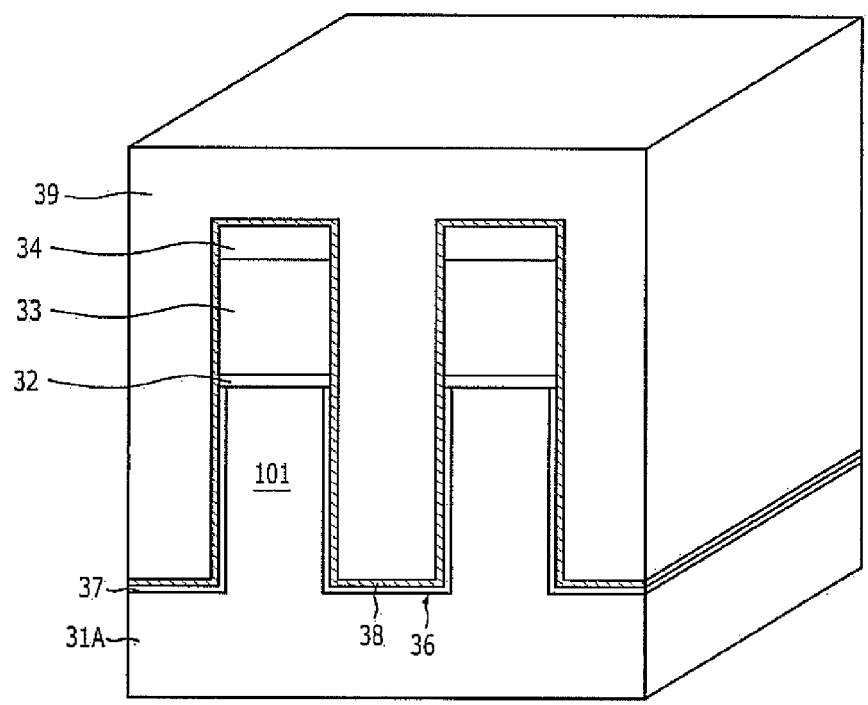
Figure 3D:
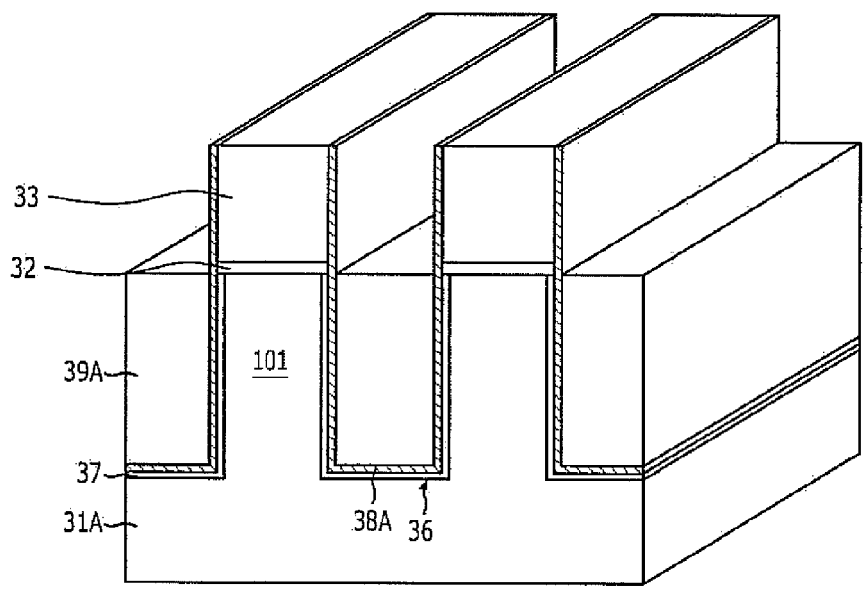
Figure 3E:
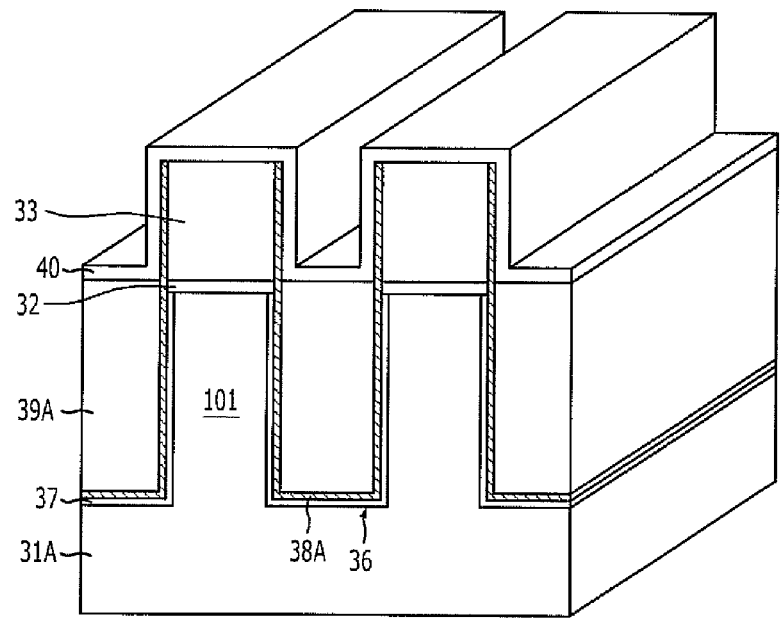
Figure 3F:
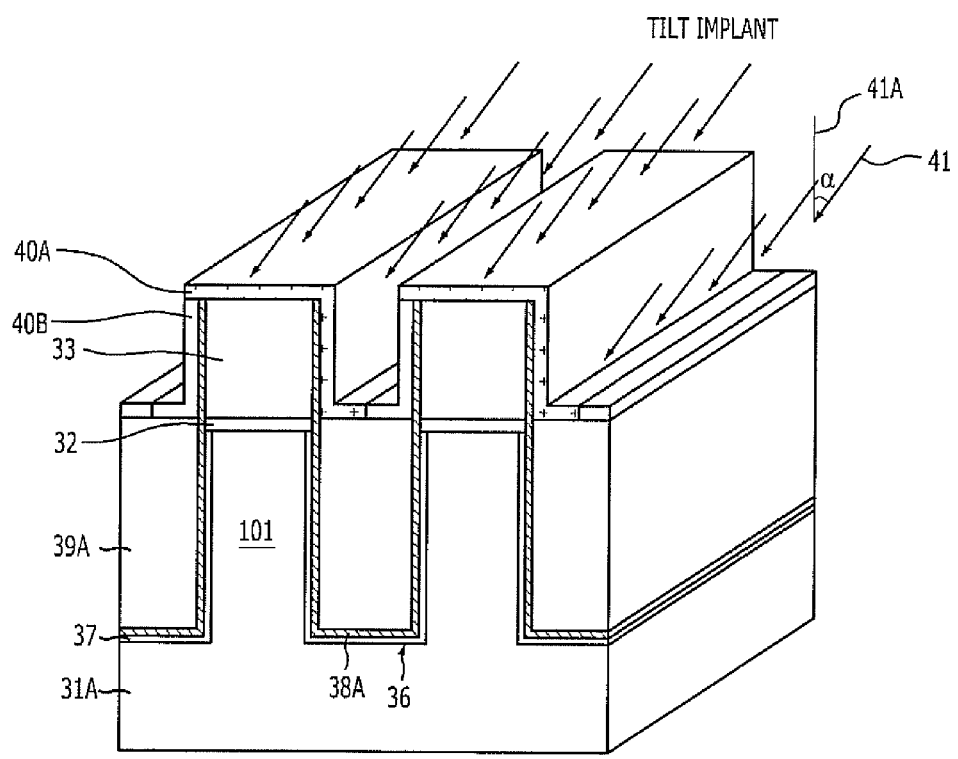
Figure 3G:
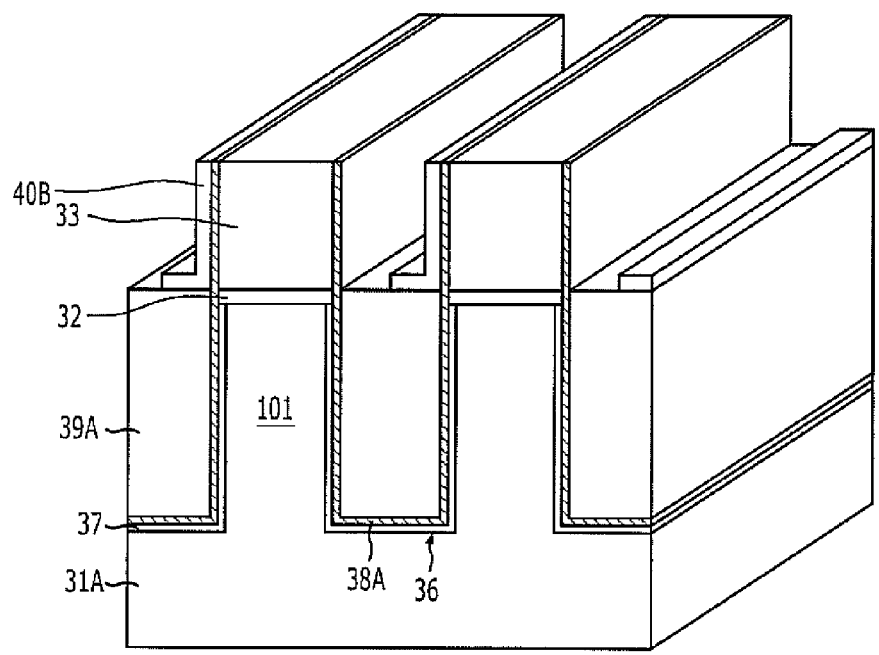
Figure 3H:
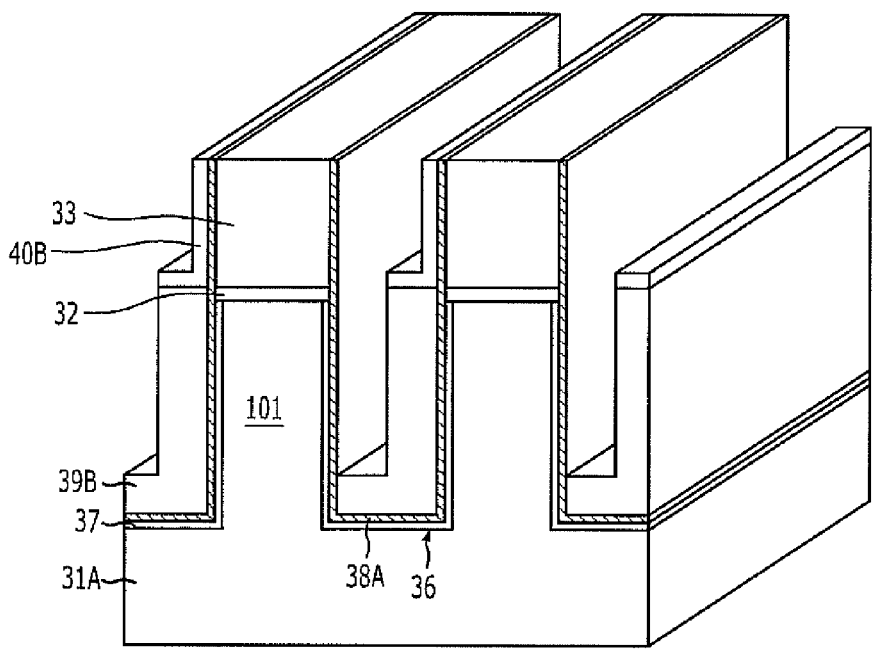
Figure 3I:
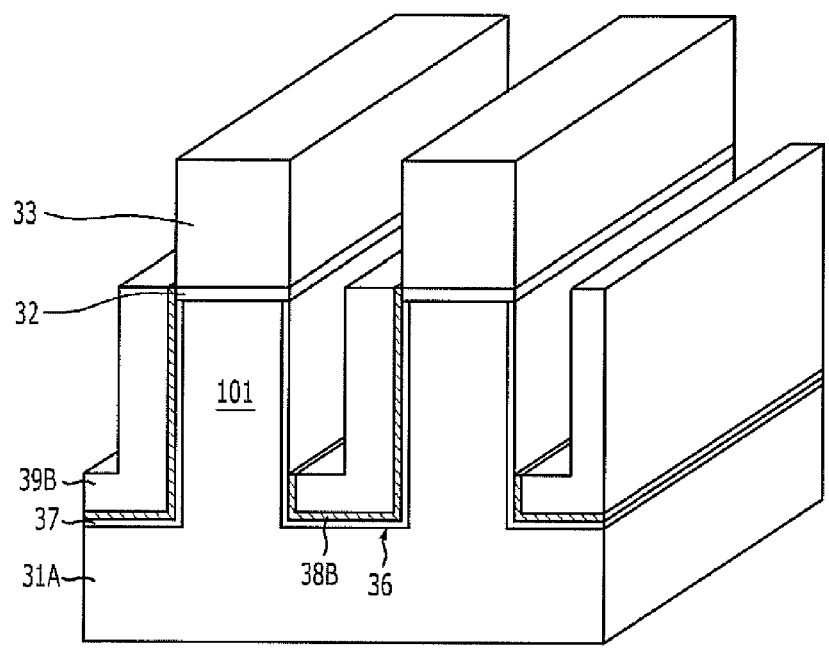
Figure 3J:
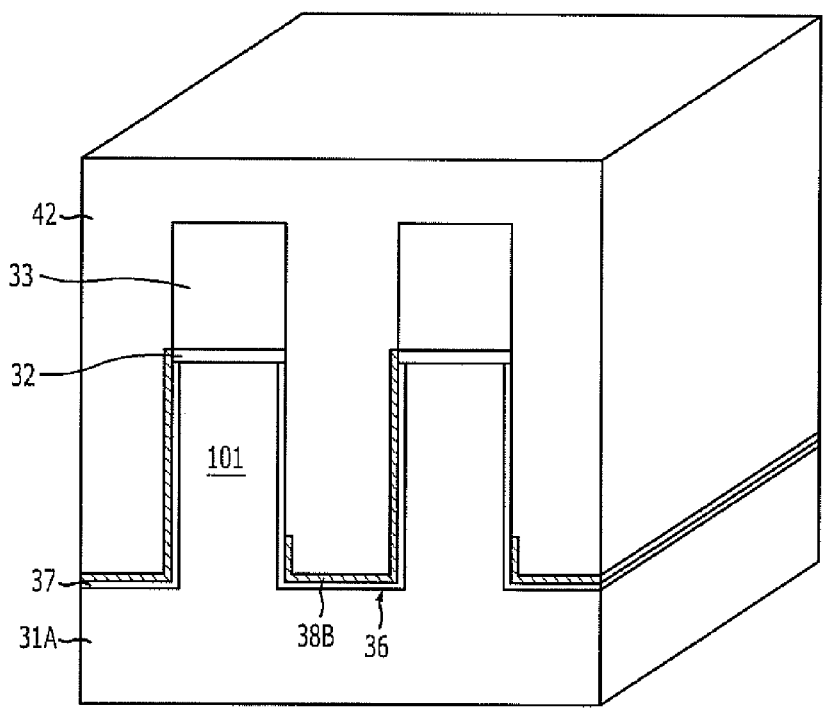
Figure 3K:
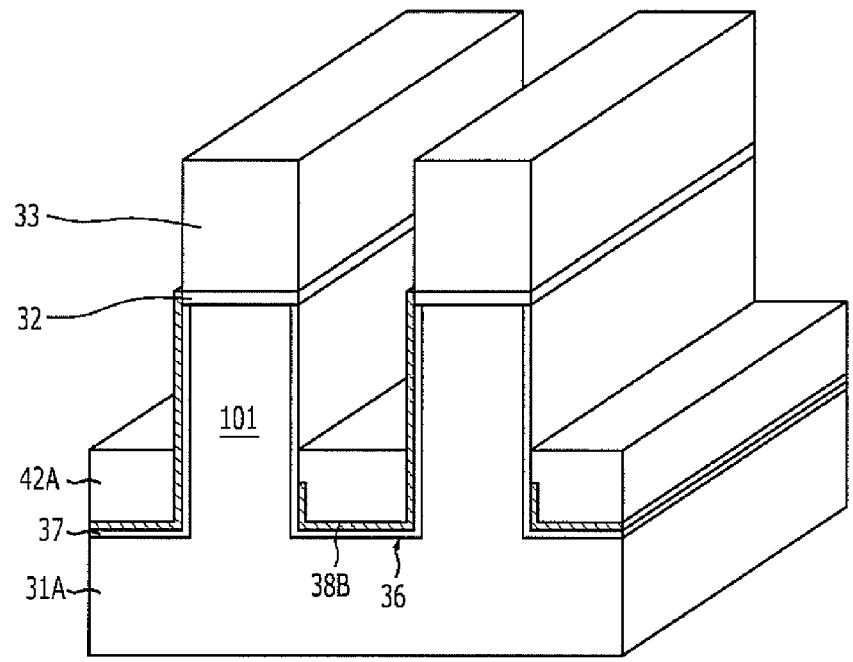
Figure 3L:
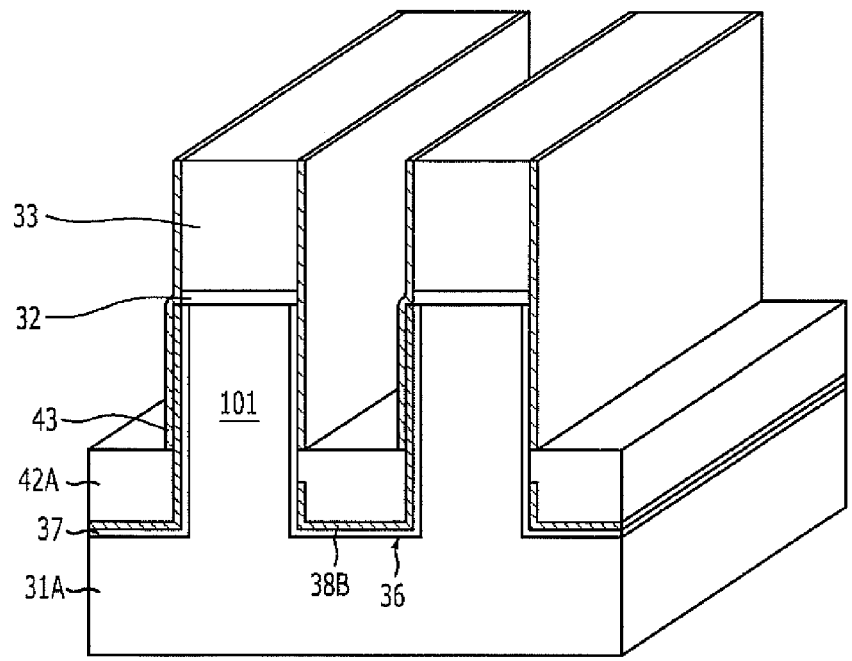
Figure 3M:
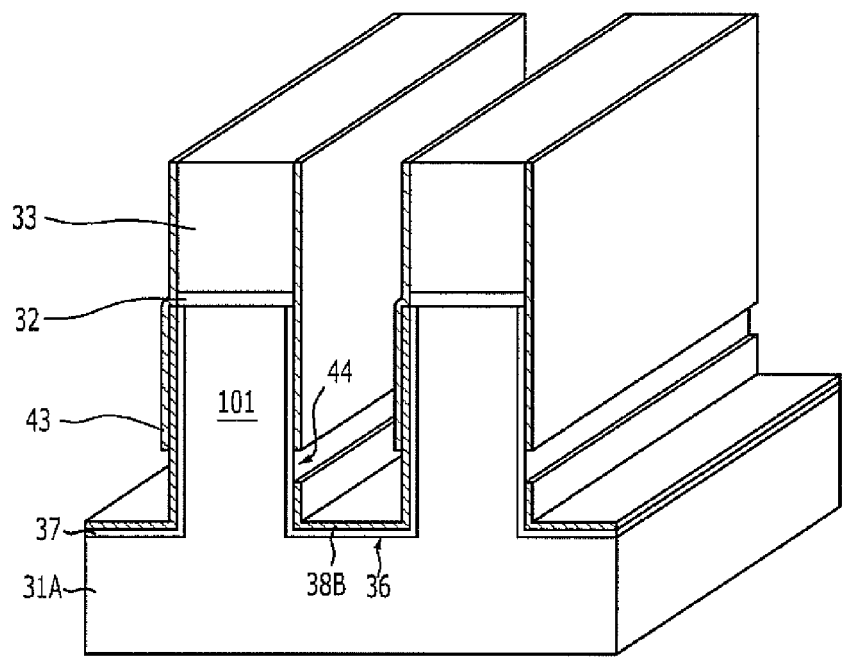
Figure 3N:
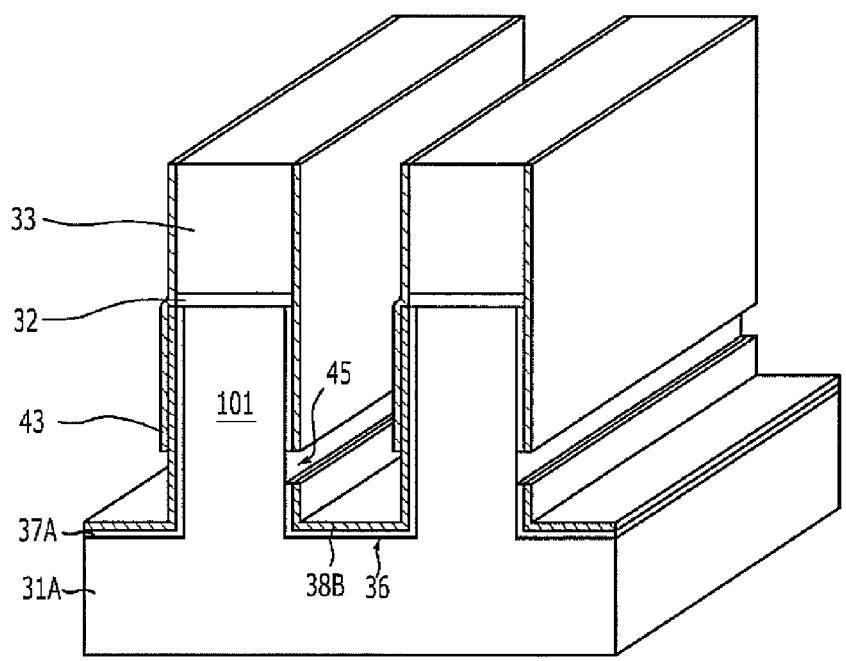
Figure 3O:
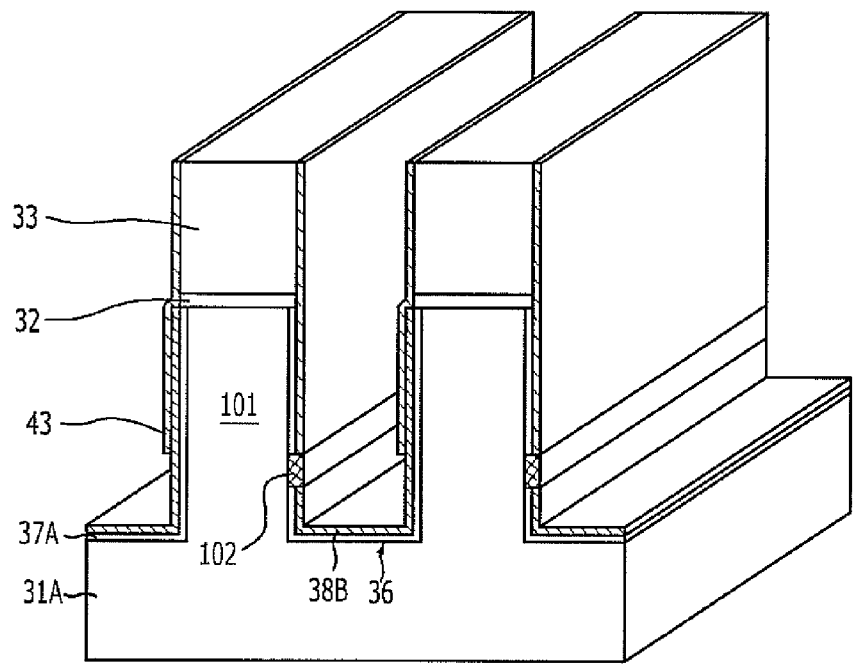
Figure 3P:
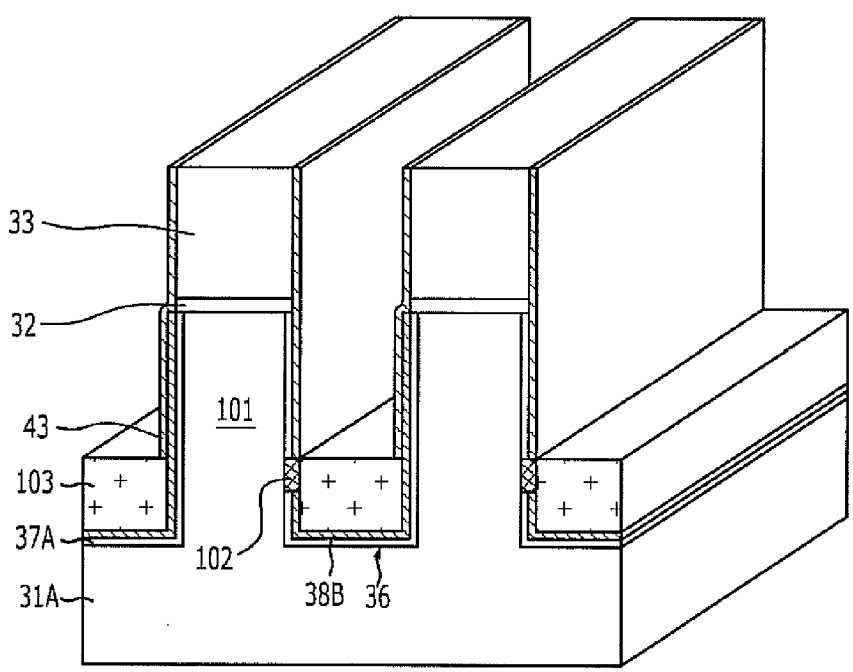

FIGS. 3A to 3P are cross-sectional views illustrating a method for fabricating a semiconductor device in accordance with an embodiment of the present invention.

Referring to FIG. 3A, a pad layer 32 is formed over a semiconductor substrate 31. Herein, the pad layer 32 may include an oxide layer.

A first hard mask layer is formed over the pad layer 32. Herein, the first hard mask layer may have a multi-layer structure including an oxide layer and a nitride layer. For example, the first hard mask layer may include a hard mask nitride layer 33 and a hard mask oxide layer 34 stacked therein. According to an example, a hard mask silicon oxynitride (SiON) layer and a hard mask carbon layer may be further stacked over the hard mask oxide layer 34.

Subsequently, a first photoresist pattern 35 is formed over the hard mask oxide layer 34. The first photoresist pattern 35 is patterned in a line-space type (for example, lines separated by spaces in between), and is referred to as "a buried bit line mask."

The hard mask oxide layer 34 and the hard mask nitride layer 33 are etched using the first photoresist pattern 35 as an etch barrier and the pad layer 32 is etched. Herein, since the shape of the first photoresist pattern 35 is transferred to the hard mask oxide layer 34 and the hard mask nitride layer 33 when the hard mask oxide layer 34 and the hard mask nitride layer 33 are etched, the hard mask oxide layer 34 and the hard mask nitride layer 33 are patterned as the line-space shape.

Referring to FIG. 3B, the first photoresist pattern 35 is removed through a photoresist strip process.

Subsequently, a trench etch process is performed using the multi-layered first hard mask layer as an etch barrier. In other words, first trenches 36 are formed by etching the semiconductor substrate 31 to a certain depth by using the hard mask oxide layer 34 as an etch barrier. As a result, a plurality of active regions 101 separated one from another by the first trenches 36 are formed.

The above-described trench etch process is referred to as "a buried bit line (BBL) trench etch process." After the BBL trench etch process, the remaining hard mask layer includes the hard mask nitride layer 33 and the hard mask oxide layer 34.

Since the active regions 101 are also formed by using the hard mask oxide layer 34 having a shape transferred from the shape of the first photoresist pattern 35, they are patterned in the line-space shape. For example, the active regions 101 are formed in a line shape and adjacent active regions are separated by the line-shaped first trenches 36.

The BBL trench etch process is an anisotropic etch process. When the semiconductor substrate 31 is a silicon substrate, the anisotropic etch process may be a plasma dry etch process using a $Cl_2$, HBr gas, or a gas mixture thereof.

Through the BBL trench etch process, the plurality of active regions 101 separated one from another by the first trenches 36 and extended in a first direction are formed over the semiconductor substrate 31A.

Referring to FIG. 3C, a sidewall oxide layer 37 is formed through a sidewall oxidation process. The sidewall oxide layer 37 is formed on the surface of the semiconductor substrate 31 and the active regions 101. For example, the sidewall oxidation process for forming the sidewall oxide layer 37 may be performed in the atmosphere of $O_2$ or $O_2/H_2$ at a temperature ranging from approximately 700° C. to approximately 900° C.

Subsequently, a first liner nitride layer 38 is deposited over the resultant structure with the sidewall oxide layer 37 formed therein. The first liner nitride layer 38 may be formed in the atmosphere of dichlorosilane (DCS) and ammonia (NH$_3$) at approximately 600° C. to approximately 800° C. under the pressure of approximately 0.1 Torr to approximately 6 Torr.

Subsequently, a first sacrificial layer 39 is formed over the first liner nitride layer 38 to gap-fill the first trenches 36 between the active regions 101, where the first sacrificial layer 39 is subject to removal after performing a subsequent process. The first sacrificial layer 39 may include an amorphous silicon layer. The amorphous silicon layer may be deposited in the atmosphere of silane (SiH$_4$) at approximately 400° C. to approximately 600° C. under the pressure of approximately 0.3 Torr to approximately 2 Torr.

Referring to FIG. 3D, the first sacrificial layer 39 is planarized through a chemical mechanical polishing (CMP) method until the surface of the hard mask nitride layer 33 is exposed, and then an etch-back process is performed additionally to make the first sacrificial layer 39 remain with a certain height. Herein, the remaining first sacrificial layer may be denoted with a reference numeral 39A and referred to as "a first sacrificial layer pattern 39A." The height of the first sacrificial layer pattern 39A may be higher than a contact surface (for example, a bottom contact surface) of the pad layer 32 and the active regions 101.

As described above, when the first sacrificial layer pattern 39A is formed through the etch-back process, the hard mask nitride layer 33 protrudes above the resulting first sacrificial layer pattern 39A. The hard mask oxide layer 34 is removed through the CMP process, and the first liner nitride layer 38 on the upper surface and sidewalls of the hard mask oxide layer 34 is polished as well. Accordingly, the remaining first liner nitride layer, which is denoted with a reference numeral '38A' and referred to as a first liner nitride layer pattern 38A, has a height high enough to cover the sidewalls of the hard mask nitride layer 33.

Referring to FIG. 3E, a liner oxide layer 40 is formed over the resultant structure to cover the protrusion of the hard mask nitride layer 33. Herein, the liner oxide layer 40 may be any reasonably suitable oxide layer having high step coverage. Oxide layers having high step coverage refer to oxide layers conformally deposited, that is, oxide layers where the thicknesses in the upper portion of the protrusion, on the surface between the protrusions, and the sidewalls of the protrusions are almost the same. With the liner oxide layer 40 deposited conformally, a subsequent tilt ion implantation process may be performed with uniformity in ion implantation. For the conformal deposition of the liner oxide layer 40, a chemical vapor deposition (CVD) method or an atomic layer deposition (ALD) method may be used.

The liner oxide layer 40 covers the protrusions of the hard mask nitride layer 33 and may be formed of an undoped oxide layer that does not include a dopant.

Referring to FIG. 3F, a dopant is implanted with a certain tilt. This process is referred to as "a tilt ion implantation process 41." The dopant is implanted at a portion of the liner oxide layer 40.

The tilt ion implantation process 41 is performed at a certain angle (α) with respect to the surface 41A of the semiconductor substrate. The angle (α) may range from approximately 5 degrees to approximately 30 degrees. Some of ion beams are shaded by the protrusions of the hard mask nitride layer 33. Therefore, a portion 40A of the liner oxide layer 40 is doped while the remaining portion of the liner oxide layer 40 remains undoped. For example, the dopant used in the ion-implantation may be a P-type dopant such as boron. A dopant source for ion-implanting boron may be BF$_2$. At the end, a portion 40B of the liner oxide layer 40 remains undoped, where the portion 40B is a portion of the liner oxide layer 40 disposed at the left side of the hard mask nitride layer 33.

The tilt ion implantation process 41 of the dopant renders a portion (40A) of the liner oxide layer 40 formed at the upper surface of the hard mask nitride layer 33 and a portion formed at the left side of the hard mask nitride layer 33 to be doped with the dopant. The portion of the liner oxide layer 40 not implanted with the dopant becomes the updoped liner oxide layer 40B.

Referring to FIG. 3G, a cleaning process is performed based on the difference between the etching rate of the doped liner oxide layer 40A and the etching rate of the updoped liner oxide layer 40B to thereby remove the doped liner oxide layer 40A. Here, the liner oxide layer 40 is etched at different etch rates according to whether it is doped with the dopant or not. For example, the doped liner oxide layer 40A is etched faster than the updoped liner oxide layer 40B. The selective etching with different etching ratios may be a wet cleaning process using HF or buffered oxide etchant (BOE), or a dry cleaning process using HF gas.

Therefore, the etching process removes the doped liner oxide layer 40A, leaving the updoped liner oxide layer 40B.

Referring to FIG. 3H, the first sacrificial layer pattern 39A (shown in FIG. 3G) adjacent to one sidewall of the active regions 101 is etched to a certain depth by using the remaining updoped liner oxide layer 40B as an etch barrier. Herein, the first sacrificial layer pattern 39A is etched to a depth to correspond to a position where a side contact is to be formed subsequently.

When the first sacrificial layer pattern 39A is etched as described above, the etched first sacrificial layer pattern 39B exposing one sidewall of the adjacent active region 101 remains.

Since the liner oxide layer 40, especially, a single layer of the updoped liner oxide layer 40B, is used as an etch barrier for forming the space where the side contacts are to be formed, space margins may be secured to facilitate miniaturization of a semiconductor device.

Also, since the liner oxide layer 40 in the upper portion of the hard mask nitride layer 33 is removed by removing the doped liner oxide layer 40A only after the tilt ion implantation process 41, it is possible to acquire a clean profile without residues remaining on the sidewall while the first sacrificial layer pattern 39A is etched.

Also, the fabrication procedure becomes relatively simple as it is performed in the order of the deposition of the liner oxide layer 40, the tilt ion implantation process 41, the removal of the doped liner oxide layer 40A, and the etching of the first sacrificial layer pattern 39A.

Referring to FIG. 3I, the updoped liner oxide layer 40B (shown in FIG. 3H) is removed and then the first liner nitride layer 38 is removed through an cleaning process. Accordingly, the first liner nitride layer pattern 38A on the upper surface and both sidewalls of the hard mask nitride layer 33, that is, the first liner nitride layer pattern 38A formed on the protrusions of the hard mask nitride layer 33, is removed. After the removal, the first liner nitride layer pattern 38B remains in a region shielded by and contacting the etched first sacrificial layer pattern 39B. The remaining first liner nitride layer pattern is denoted with a reference numeral '38B' and referred to as a first liner nitride layer pattern residue 38B. In order to leave the sidewall oxide layer 37 on the sidewall of the active regions 101, a wet cleaning process may be used or a dry cleaning process having a selectivity (for example, an etching selectivity) with respect to an oxide layer may be used in removing the first liner nitride layer pattern 38A on the upper surface and both sidewalls of the hard mask nitride layer 33.

Referring to FIG. 3J, after the first sacrificial layer pattern 39A is completely removed, a second sacrificial layer 42 is formed over the resultant structure for gap-filling. The second sacrificial layer 42 may include an amorphous silicon layer.

Referring to FIG. 3K, the second sacrificial layer 42 is planarized through a chemical mechanical polishing (CMP) process until a surface of the hard mask nitride layer 33 is exposed and etched back to remain with a certain thickness. Herein, the planarized second sacrificial layer 42 is denoted with a reference numeral '42A' and referred to as "a second sacrificial layer pattern 42A." As a result, the second sacrificial layer pattern 42A remains with a certain height, where the height of the second sacrificial layer pattern 42A corresponds to a height sufficient for defining a space where the side contacts are to be formed subsequently. In other words, when the second sacrificial layer pattern 42A is etched back, both sidewalls of the hard mask nitride layer 33 and the active region 101 are exposed with the exception of the sidewall oxide layer 37 remaining on the sidewalls of the active region 101. However, the polysilicon slurry is used during the CMP process for planarizing the second sacrificial layer 42, it is possible to protect the hard mask nitride layer 33 from being damaged.

Referring to FIG. 3L, a second liner nitride layer 43 is formed over the resultant structure and a selective etch is performed to expose a surface (for example, an upper surface) of the second sacrificial layer pattern 42A. Accordingly, a double insulation layer structure of the sidewall oxide layer 37 and the second liner nitride layer 43 is formed on the sidewall of the active region 101. Only the sidewall oxide layer 37 exists between the active region 101 and the second sacrificial layer pattern 42A in the region where the second sacrificial layer pattern 42A is positioned and the side contacts are to be formed. A single insulation structure of the second liner nitride layer 43 is formed on the sidewall of the hard mask nitride layer 33. According to an example, the second liner nitride layer 43 is formed in the atmosphere of dichlorosilane (DCS) and $NH_3$ at a temperature of approximately 600° C. to approximately 800° C. under the pressure of approximately 0.1 Torr to approximately 6 Torr.

Referring to FIG. 3M, the second sacrificial layer pattern 42A is removed. Accordingly, a line-type opening 44 is opened on just one side of the active region 101.

Herein, the opening 44 is a space acquired by removing the second sacrificial layer pattern 42A between the first liner nitride layer pattern residue 38B and the second liner nitride layer 43.

Referring to FIG. 3N, the sidewall oxide layer 37 exposed through the opening 44 is selectively removed to thereby form a contact region 45 which exposes a portion of one sidewall of the active region 101 in the shape of a line. The sidewall oxide layer 37 may be removed through an cleaning process in order to form the contact region 45. For example, when the resultant structure is wet cleaned using HF or BOE, the sidewall oxide layer 37 can be selectively removed without damaging the neighboring liner nitride layers. Remaining sidewall oxide layer 37 is denoted with a reference numeral '37A' and referred to as "a remaining sidewall oxide layer 37A."

Referring to FIG. 3O, a side contact 102 is formed in the contact region 45. Herein, the side contact 102 may include a metal silicide. For example, the metal silicide may include titanium silicide ($TiSi_2$), cobalt silicide ($CoSi_2$), and nickel silicide (NiSi). In order to prevent properties of the resultant structure from being deteriorated during a subsequent high-temperature thermal treatment, cobalt silicide ($CoSi_2$) may be selected because it is thermally stable.

For example, the cobalt silicide is formed by depositing a cobalt layer over the resultant structure and performing a thermal treatment. The thermal treatment may be performed at least two times in order to form cobalt silicide ($CoSi_2$). First, cobalt silicide of CoSi phase is formed in the area where the contact region is exposed by performing a rapid thermal annealing (RTA) at approximately 500° C. Subsequently, another rapid thermal annealing is performed at approximately 700° C. to transform the CoSi phase into $CoSi_2$ phase. Subsequently, the cobalt layer remaining unreacted is removed. The unreacted cobalt layer may be removed before the secondary rapid thermal annealing process.

The side contact 102 has a one-side-contact which is formed only on one sidewall of the active region 101.

Referring to FIG. 3P, a bit line conductive layer is deposited over the resultant structure with the side contact 102. Herein, the bit line conductive layer is deposited over the resultant structure to gap-fill the first trenches between the first trenches 36. The bit line conductive layer includes a metal layer such as a titanium nitride (TiN) layer or a tungsten (W) layer. For example, the bit line conductive layer may be formed by stacking a titanium nitride layer and a tungsten layer (TiN/W).

Subsequently, the bit line conductive layer is removed to a height allowing a contact with the side contact 102. As a result, a metal bit line 103 contacting the side contact 102 is formed. The metal bit line 103 is arranged in parallel to the active region 101, and the active region 101 and the metal bit line 103 are electrically connected through the side contact 102. The active region 101 and the metal bit line 103 may extend in a first direction.

As described above, since the metal bit line 103 is formed of a metal layer, resistance becomes relatively low. The first trenches 36 between the active regions 101 are filled (at least partially) by the metal bit line 103, and thus, the metal bit line 103 constitutes a buried bit line. Thus, according to an exemplary embodiment of the present invention, a separate trench process for separating the metal bit lines is not required.

Hereafter, a method for forming a word line over the upper portion of the metal bit line 103 is described.

FIGS. 4A to 4F are perspective views illustrating a method for forming word lines in a semiconductor device in accordance with an embodiment of the present invention.

Figure 4A:
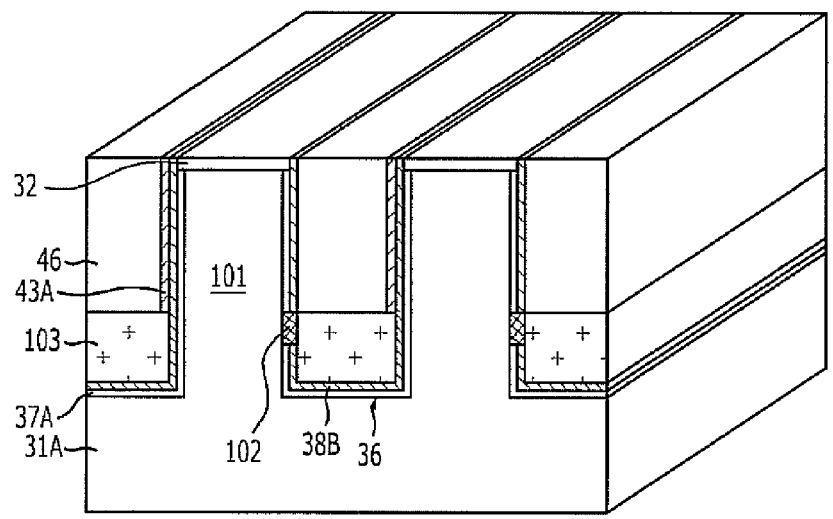
FIGS. 4A to 4F are perspective views illustrating a method for forming word lines in a semiconductor device in accordance with an embodiment of the present invention.

Referring to FIG. 4A, a first interlayer dielectric layer is formed to insulate the metal bit lines 103 from the word lines to be formed in a second direction. A third liner nitride layer (not shown) may be formed in advance before the first interlayer dielectric layer is formed. The first interlayer dielectric layer may include borophospho silicate glass (BPSG) or polysilazane (PSZ).

Then, the first interlayer dielectric layer is planarized. The planarized first interlayer dielectric layer is denoted with a reference numeral '46' and referred to as "a first interlayer dielectric layer pattern 46." The planarization process for the first interlayer dielectric layer may be performed until the pad oxide layer 32 remains. As a result, a second liner nitride layer pattern 43A with a decreased height remains.

Figure 4B:
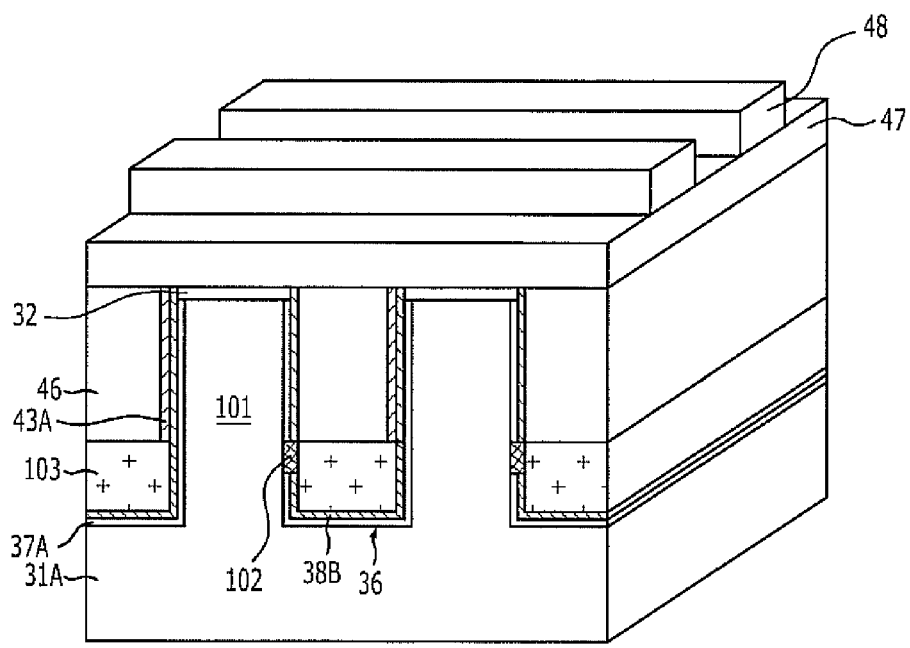

Referring to FIG. 4B, after a second hard mask layer 47 is formed, a second photoresist layer pattern 48 is formed in a shape of lines in the second direction. Herein, the second hard mask layer 47 includes a nitride layer, and the second direction is a direction perpendicular to the first direction.

Figure 4C:
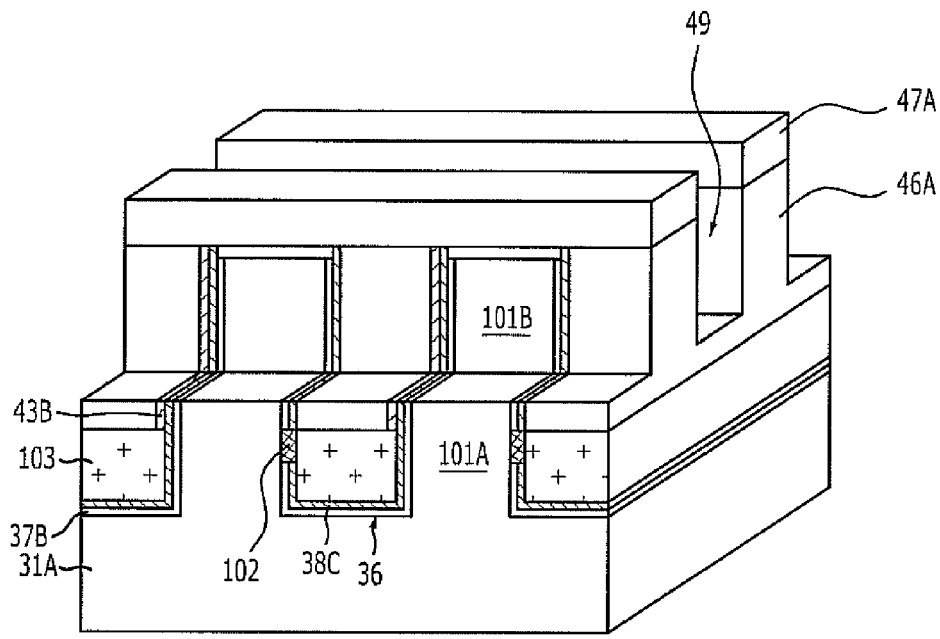

Referring to FIG. 4C, the second hard mask layer 47 is etched using the second photoresist layer pattern 48 as an etch barrier. The active regions 101 and the first interlayer dielectric layer pattern 46 are etched to a certain depth by using the etched second hard mask layer 47A as an etch barrier. The etched active regions 101 and the etched first interlayer dielectric layer pattern 46 are denoted with a reference numeral '101A' and '46A,' respectively. Herein, the etch process may be performed after the second photoresist layer pattern 48 is removed. While the active regions 101 and the first interlayer dielectric layer pattern 46 are etched, the first liner nitride layer pattern residue 38B and the second liner nitride layer pattern 43A may also be etched. When the first liner nitride layer pattern residue 38B and the second liner nitride layer pattern 43A are etched, the first liner nitride layer pattern residue 38B is denoted with a reference numeral '38C' and the second liner nitride layer pattern 43A is denoted with a reference numeral '43B.'

Accordingly, a plurality of active pillars 1018 are formed where they are separated from each other and are formed over the respective active regions 101A. The spaces between the active pillars 101B constitute second trenches 49. Herein, the second trenches 49 may be referred to as "damascene patterns." At the bottom of the second trenches 49, the etched first interlayer dielectric layer pattern 46A may remain at a certain thickness. In this way, the bit lines may be insulated from word lines formed subsequently.

Figure 4D:
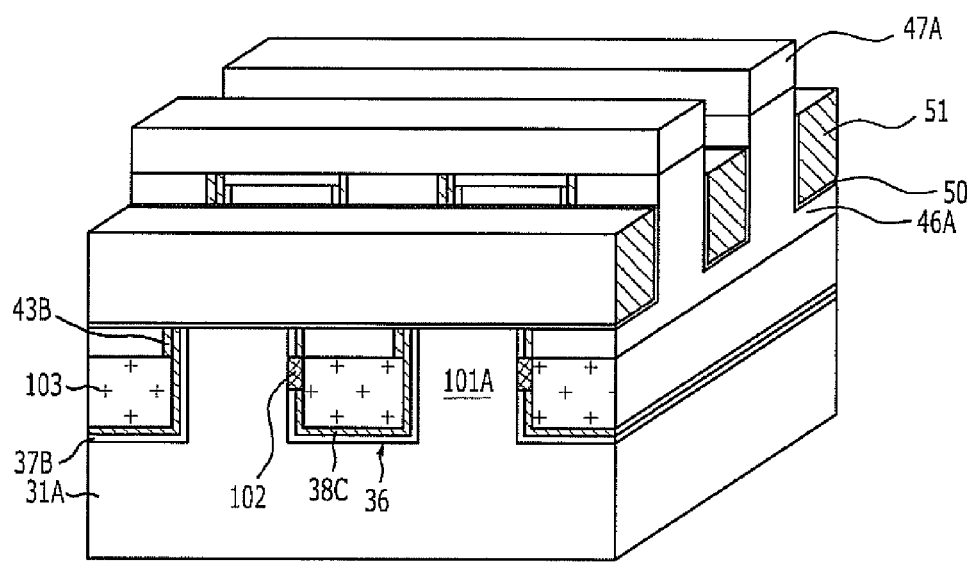

Referring to FIG. 4D, after a gate insulation layer 50 is formed on the sidewall of the active pillars 101B, a word line conductive layer 51 to be used as word lines is deposited over the gate insulation layer 50. Subsequently, an etch-back process is performed onto the word line conductive layer 51 to a certain thickness for formation of word lines. Herein, the word line conductive layer 51 may be formed by stacking a titanium nitride layer and a tungsten layer (TiN/W).

Figure 4E:
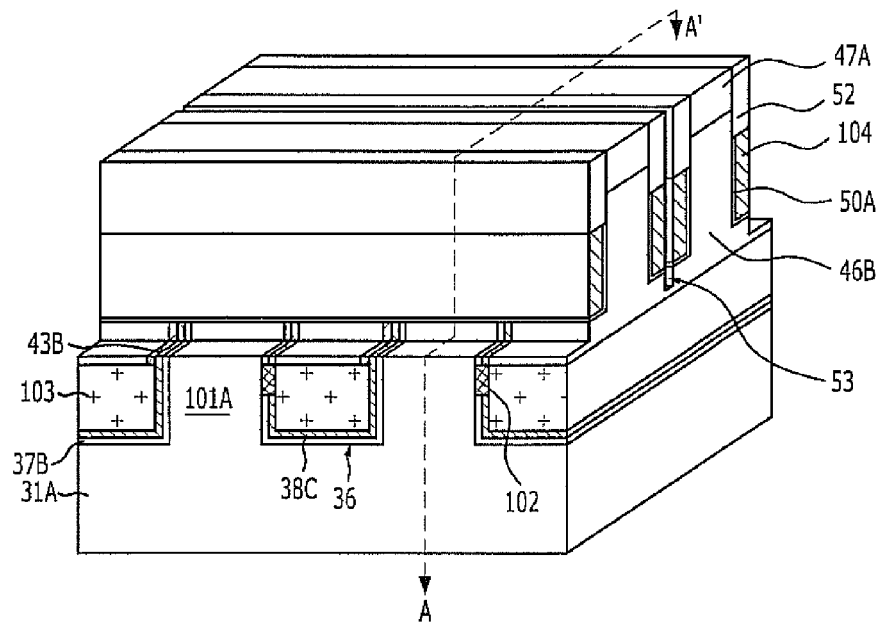

Referring to FIG. 4E, spacers 52 are formed on the upper portion of the etched word line conductive layer and the sidewalls of the etched second hard mask layer 47A, and word lines 104 are formed by etching the etched word line conductive layer in such a manner that they are aligned with the spacers 52. When the etched word line conductive layer is etched, a third trench 53 may be formed is where the etched first interlayer dielectric layer pattern 46A is further etched so that adjacent word lines 104 are sufficiently separated. The further etched first interlayer dielectric layer pattern 46A is denoted with a reference numeral '46B' hereafter. The spacers 52 may be formed by depositing a nitride layer and then performing an etch-back process.

Figure 4F:
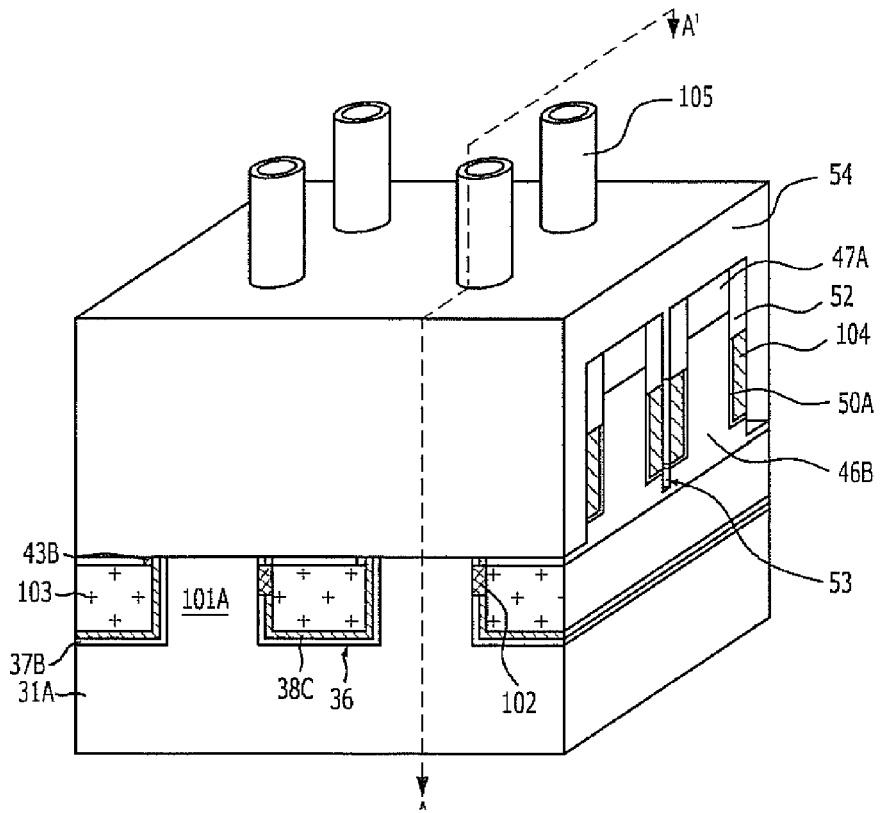

Referring to FIG. 4F, a second interlayer dielectric layer 54 is formed over the resultant structure including the word lines 104 to gap-fill the third trench 53.

Subsequently, a storage node contact plug 55 (shown in FIG. 5B) penetrating the second interlayer dielectric layer 54 is formed. Herein, the storage node contact plug 55 is electrically connected to the upper portion of the active pillars 101B (shown in FIG. 5B).

Subsequently, a storage node 105 is formed over the second interlayer dielectric layer 54. According to an example, the storage node 105 may have a cylindrical shape, where the storage node 105 constitutes a storage node of a capacitor.

Figure 5A:
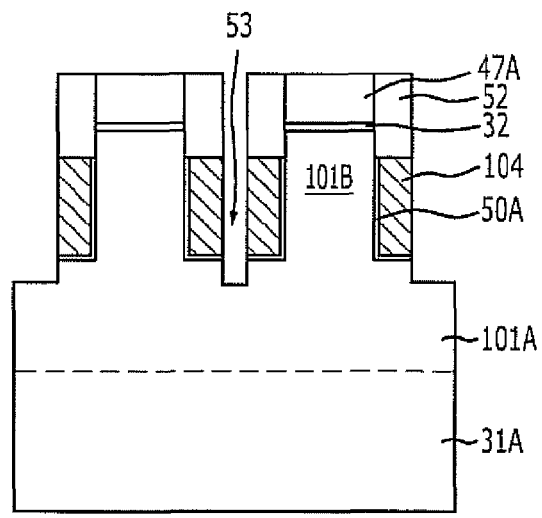
FIG. 5A is a cross-sectional view of the semiconductor device of FIG. 4E along line A-A'.
Figure 5B:
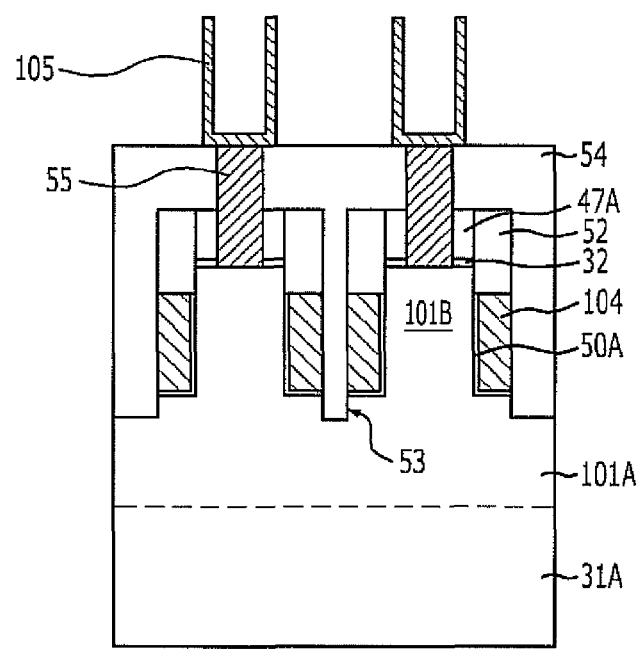
FIG. 5B is a cross-sectional view of the semiconductor device of FIG. 4F along line A-A'.

FIG. 5A is a cross-sectional view showing the semiconductor device of FIG. 4E taken along line A-A', and FIG. 5B is a cross-sectional view showing the semiconductor device of FIG. 4F taken along line A-A'.

Figure 6A:
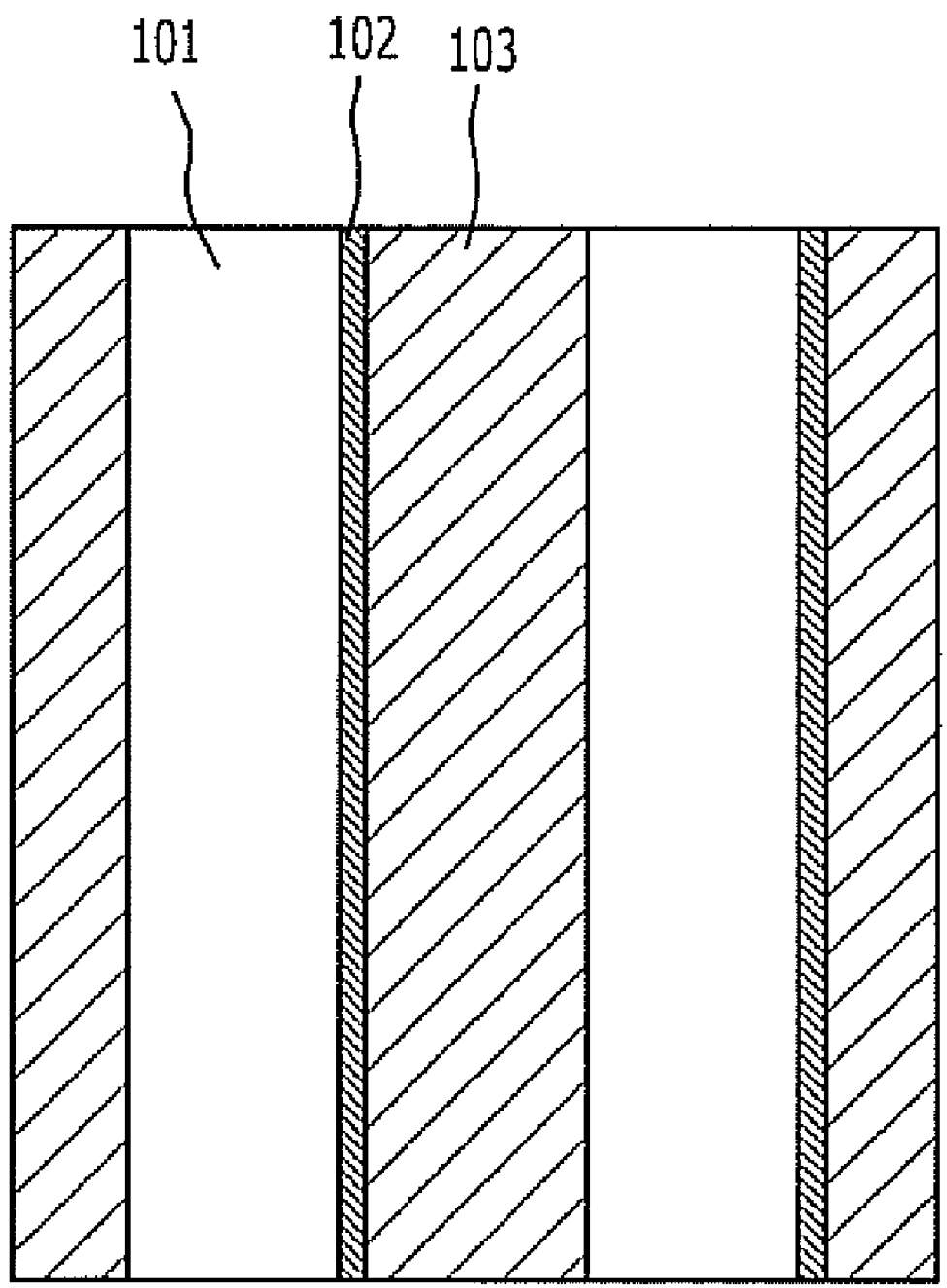
FIG. 6A is a plan view illustrating a resultant substrate after metal bit lines are formed.

FIG. 6A is a plan view illustrating a resultant substrate after metal bit lines are formed. Referring to FIG. 6A, the metal bit lines 103 are formed in a direction parallel to one sidewall of the active region 101, and one sidewall of the active region 101 is electrically connected to the metal bit lines 103 through the side contact 102.

Figure 6B:
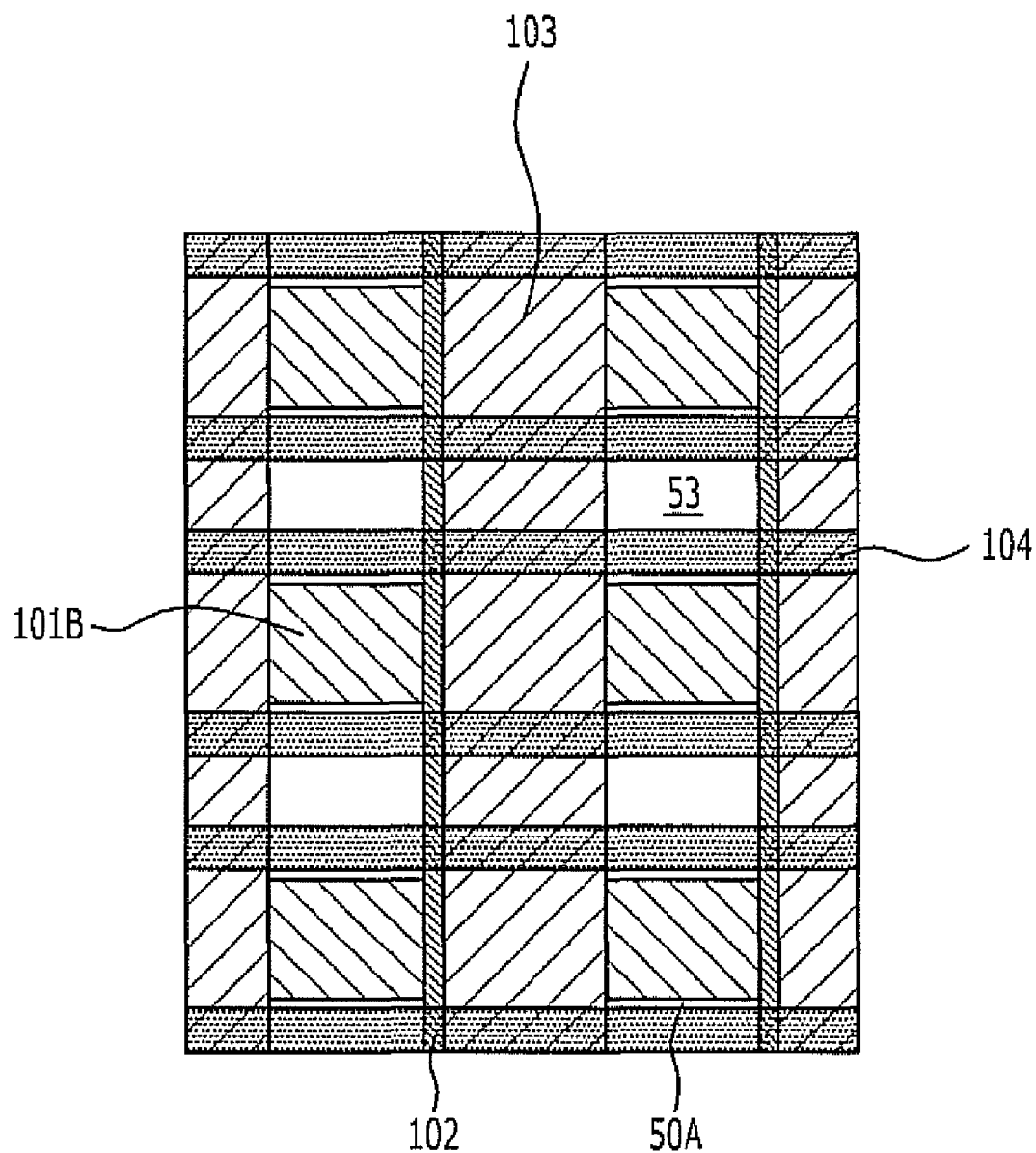
FIG. 6B is a plan view illustrating a resultant substrate after word lines are formed.

FIG. 6B is a plan view illustrating a resultant substrate after word lines are formed. Referring to FIG. 6B, the plurality of the active pillars 101B are formed where they are separated from each other by the third trench 53, and the word lines 104 are positioned on both sidewalls of the active pillars 101B with the gate insulation layer 50A therebetween. The metal bit lines 103 are extended in the first direction, and the word lines 104 are extended in the second direction. Therefore, the word lines 104 cross the metal bit lines 103. A side contact 102 is formed on one sidewall of the metal bit line 103.

According to an exemplary embodiment of the present invention, an updoped liner oxide layer is used as an etch barrier when the first sacrificial layer is etched to expose one sidewall of the active region. However, a liner nitride layer may be used as the etch barrier according to another embodiment. According to an example, after a liner nitride layer is deposited, a doped portion of the liner oxide layer may be formed where a dopant is implanted through a tilt ion implantation is separated from an undoped portion where a dopant is not implanted through the tilt ion implantation, and subsequently. A liner nitride layer on one side is removed based on an etch rate difference controlled by the dopant implantation.

An exemplary embodiment of the present invention described above can realize a semiconductor device that can be miniaturized without deterioration in operation characteristics by forming buried bit lines of metal to reduce resistance.

Also, according to an exemplary embodiment of the present invention, since a one-side-contact is applied to a contact region between the buried bit line formed of metal and the active pillar, ohmic contact may be formed.

Furthermore, since a liner oxide layer exposing one sidewall of an active pillar is used as an etch barrier to form a one-side-contact, acquisition of space to cope with miniaturization of a semiconductor device may be achieved.

In addition, by utilizing a difference in etch rates based on dopant implantation into an insulation layer (which is an oxide layer or a nitride layer), margins for etching process may be obtained.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    etching a semiconductor substrate to form a plurality of active regions which are separated from one another by trenches formed in between;
    forming a side contact on a sidewall of each active region;
    forming metal bit lines, each filling a portion of each trench and connected to the side contact;
    forming a plurality of active pillars which are separated from one another in a damascene pattern over each active region by etching the active regions; and
    forming word lines extended in a direction crossing the metal bit lines and positioned on sidewalls of the active pillars by forming a conductive layer filling the damascene pattern and etching the conductive layer using a spacer as an etch barrier.

2. The method of claim 1, wherein the active regions are formed in a line shape, and the side contact and the metal bit line are formed in parallel to the active regions.

3. The method of claim 1, wherein the side contact comprises a metal silicide.

4. The method of claim 1, wherein the metal bit line is formed by stacking a titanium nitride layer and a tungsten layer (TiN/W).

5. The method of claim 1, further comprising:
forming a capacitor with a storage node connected to an upper portion of the active pillar.

6. A method for fabricating a semiconductor device, comprising:
etching a semiconductor substrate to form a plurality of active regions separated from one another by trenches formed in between;
forming a sacrificial layer gap-filling the trenches, wherein a protrusion is formed over each active region from the formation of the sacrificial layer;
forming an insulation layer pattern contacting a sidewall of the protrusion; etching the sacrificial layer by using the insulation layer pattern as an etch barrier;
forming contact regions each opening a sidewall of the active regions; forming side contacts each filling the contact regions;
forming metal bit lines, each being connected to each side contact and filling a portion of each trench;
forming a plurality of active pillars which are separated from one another in a damascene pattern over each active region by etching the active regions; and
forming word lines extended in a direction crossing the metal bit lines and positioned on sidewalls of the active pillars by forming a conductive layer filling the damascene pattern and etching the conductive layer using a spacer as an etch barrier.

7. The method of claim 6, wherein the insulation layer pattern comprises an undoped insulation layer.

8. The method of claim 6, wherein the trenches are formed by using a hard mask layer as an etch barrier and etching the semiconductor substrate, and the protrusion is formed of the hard mask layer.

9. The method of claim 6, wherein the metal bit lines are formed by stacking a titanium nitride layer and a tungsten layer (TiN/W).

10. The method of claim 6, wherein the side contact comprises a metal silicide.

11. The method of claim 6, wherein the active regions are formed in a line shape, and the side contact and the metal bit lines are formed to be arranged in parallel to the active regions.

12. The method of claim 6, further comprising:
forming a capacitor with a storage node connected to an upper portion of the active pillar.

13. The method of claim 6, before the formation of the sacrificial layer, further comprising:
forming a sidewall oxide layer on sidewalls of each active region through a sidewall oxidation; and
forming a first liner nitride layer covering a resultant substrate including the active regions.

14. A method for fabricating a semiconductor device, comprising:
etching a semiconductor substrate to form a plurality of active regions separated from one another by trenches formed in between;
forming a sidewall oxide layer on sidewalls of each active region through a sidewall oxidation;
forming a first liner nitride layer covering a resultant substrate including the active regions;
forming a sacrificial layer gap-filling the trenches, wherein a protrusion is formed over each active region from the formation of the sacrificial layer;
forming an insulation layer pattern contacting a sidewall of the protrusion: etching the sacrificial layer by using the insulation layer pattern as an etch barrier;
forming contact regions each opening a sidewall of the active regions;
forming side contacts each filling the contact regions; and
forming metal bit lines, each being connected to each side contact and filling a portion of each trench,
wherein the forming of the contact regions comprises:
removing the sacrificial layer;
forming an amorphous silicon layer gap-filling the trenches;
performing an etch-back process to the amorphous silicon layer;
forming a second liner nitride layer on a sidewall of the active region to expose a surface of the amorphous silicon layer obtained after the etch-back process;
forming a line-shaped opening by removing the amorphous silicon layer; and
selectively etching the sidewall oxide layer through the opening.

15. The method of claim 14, wherein the sidewall oxide layer is selectively etched through the opening by performing a wet cleaning process.

16. A method for fabricating a semiconductor device, comprising:
etching a semiconductor substrate to form a plurality of active regions separated from one another by trenches formed in between;
forming a sacrificial layer gap-filling the trenches, wherein a protrusion is formed over each active region from the formation of the sacrificial layer;
forming an insulation layer over the substrate including the protrusion; implanting a dopant into the insulation layer through a tilt ion implantation process;
forming an insulation layer pattern by selectively removing a portion of the insulation layer where the dopant is implanted;
etching the sacrificial layer by using the insulation layer pattern as an etch barrier;
forming contact regions each opening a sidewall of the active regions;
forming side contacts each filling the contact regions;
forming metal bit lines, each being connected to each side contact and filling a portion of each trench;
forming a plurality of active pillars which are separated from one another in a damascene pattern over each active region by etching the active regions; and
forming word lines extended in a direction crossing the metal bit lines and positioned on sidewalls of the active pillars by forming a conductive layer filling the damascene pattern and etching the conductive layer using a spacer as an etch barrier.

17. The method of claim 16, wherein the insulation layer pattern comprises an undoped insulation layer.

18. The method of claim 16, wherein the dopant comprises boron.

19. The method of claim 16, wherein the portion of the insulation layer where the dopant is implanted is selectively removed through a wet cleaning process or a dry cleaning process.

* * * * *